(12) United States Patent
Park et al.

(10) Patent No.: US 6,885,804 B2
(45) Date of Patent: Apr. 26, 2005

(54) SEMICONDUCTOR OPTICAL DEVICES WITH DIFFERENTIAL GRATING STRUCTURE AND METHOD FOR MANUFACTURING THE SAME

(75) Inventors: Kyung-hyun Park, Daejon (KR); Jung-ho Song, Jeju (KR); Sung-bock Kim, Daejon (KR); Kwang-ryong Oh, Daejon (KR)

(73) Assignee: Electronics and Telecommunications Research Institute (KR)

( * ) Notice: Subject to any disclaimer, the term of this patent is extended or adjusted under 35 U.S.C. 154(b) by 30 days.

(21) Appl. No.: 10/280,691

(22) Filed: Oct. 25, 2002

(65) Prior Publication Data

US 2003/0147617 A1 Aug. 7, 2003

(30) Foreign Application Priority Data

Feb. 7, 2002 (KR) .......................................... 2002-7011

(51) Int. Cl.$^7$ ................................................ G02B 6/10
(52) U.S. Cl. ........................... 385/131; 385/37; 372/43; 372/92; 372/102
(58) Field of Search .......................... 385/10, 37, 131; 372/43, 50, 64, 96, 99, 102

(56) References Cited

U.S. PATENT DOCUMENTS

| | | | | |
|---|---|---|---|---|
| 5,648,978 A | * | 7/1997 | Sakata .......................... | 372/50 |
| 6,122,306 A | | 9/2000 | Sartorius et al. | |
| 6,215,805 B1 | | 4/2001 | Sartorius et al. | |
| 6,219,369 B1 | * | 4/2001 | Portnoi et al. ................. | 372/96 |
| 6,337,868 B1 | * | 1/2002 | Mizutani ...................... | 372/27 |
| 6,580,740 B1 | * | 6/2003 | Funabashi et al. ............ | 372/50 |
| 6,608,855 B1 | * | 8/2003 | Hwang et al. ................. | 372/96 |
| 6,674,783 B1 | * | 1/2004 | Funabashi et al. ............ | 372/96 |
| 2002/0192850 A1 | * | 12/2002 | Stoltz et al. ................... | 438/22 |
| 2003/0091080 A1 | * | 5/2003 | Aoyagi et al. ................. | 372/45 |
| 2003/0091081 A1 | * | 5/2003 | Sahara et al. .................. | 372/45 |

FOREIGN PATENT DOCUMENTS

| | | | | |
|---|---|---|---|---|
| DE | 3934865 A1 | * | 4/1991 | ........... G02B/6/12 |
| DE | 4420389 A1 | * | 12/1995 | ........... H01S/3/105 |
| JP | 63020892 A | * | 1/1988 | ............ H01S/3/18 |
| JP | 02263491 A | * | 10/1990 | ............ H01S/3/18 |
| JP | 04349683 A | * | 12/1992 | ............ H01S/3/18 |
| JP | 06005971 A | * | 1/1994 | ............ H01S/3/18 |

OTHER PUBLICATIONS

Electronics Letters, Feb. 17th, 2000, vol. 396, No. 4, "Self-pulsating DFB laser for all-optical clock recover at 40Gbit/s", 2 pages.

* cited by examiner

*Primary Examiner*—Ellen E. Kim
(74) *Attorney, Agent, or Firm*—Blakely Sokoloff Taylor & Zafman

(57) ABSTRACT

A semiconductor optical device with a differential grating formed by a holography method and a method for manufacturing the same are provided. The provided semiconductor optical device includes an n-type InP substrate, a stack structure on the InP substrate having a waveguide and active layers, a first grating formed under the stack structure and on the InP substrate, and a second grating formed on the stack structure. The provided method for manufacturing the semiconductor optical device forms a first grating on the n-type InP substrate and under the active layer, and forms a second grating on the active layer. The first and second gratings are formed by the holography method.

19 Claims, 5 Drawing Sheets

SEMICONDUCTOR OPTICAL DEVICES WITH DIFFERENTIAL GRATING STRUCTURE AND METHOD FOR MANUFACTURING THE SAME

BACKGROUND OF THE INVENTION

This application claims the priority of Korean Patent Application No. 2002-7011, filed Feb. 7, 2002, which is incorporated herein in its entirety by reference.

1. Field of the Invention

The present invention relates to a semiconductor optical device and a method for manufacturing the same, and more particularly, to a semiconductor optical device having a differential grating structure and a method for manufacturing the same.

2. Description of the Related Art

Functional optical devices, which select a specific wavelength in a wavelength division multiplexing (WDM) network, including a distributed feedback (DFB) laser diode having a narrow optical spectrum, which is required to increase a transmission distance in optical communications, perform a wavelength filtering operation by using gratings and various kinds of grating structures have been developed and published. In a semiconductor optical device, a periodical variation of the refractive index of lightwave, which progresses toward the optical device, is affected by a wavelength filtering operation. Thus, a specific wavelength corresponding to a Bragg wavelength is reflected and fed back to a gain region in the semiconductor optical device in order to operate a specific wavelength. Such a semiconductor optical device is manufactured by performing a plurality of processes, for example, growth and regrowth of a semiconductor material, formation of a grating, dry and wet etchings, and formation of electrodes. Especially, a holography method for attaining a uniform grating on a large area is commonly used in the formation of a grating. In order to constitute a grating in a special shape, an electron-beam lithography method may be used. When using the electron-beam lithography method, optical filtering characteristics of the optical device are attained, but an electron-beam direct writing method of the electron-beam lithography method increases a process time, which causes a limit in the increase of the yield of the devices. Accordingly, most of optical devices including a grating are manufactured by the holography method.

Demands for optical devices having special functions, such as a self-pulsating DFB laser diode for generating and processing high-speed optical signals, have increased recently. In manufacturing such optical devices, the conventional holography method has limits in constituting a grating. For example, U.S. Pat. No. 6,215,805B1 discloses a Q-switched semiconductor laser having two reflectors with different periods. In order to manufacture the Q-switched semiconductor laser, gratings with different periods have to be formed on an active layer and a reflective layer, respectively. In this case, the gratings cannot be formed by the conventional holography method. Actually, the above US patent constituted the reflectors with different reflective characteristics by forming gratings with different periods on the active and reflective layers by the electron-beam lithography method. Accordingly, in order to manufacture special gratings, for example, the gratings with different periods and refractive indexes, the electron-beam lithography method has been used. In this case, the direct writing method limits the yield of the optical devices, which causes a limit in ensuring commercial availability of the optical devices.

As a result, a method for manufacturing various kinds of optical devices by forming gratings by a holography method is required to improve the yield of optical devices.

SUMMARY OF THE INVENTION

To solve the above-described problems, it is an objective of the present invention to provide a semiconductor optical device having a novel structure and an improved yield.

It is another objective of the present invention to provide a method for manufacturing a semiconductor optical device by a holography method to improve yield.

To accomplish the above objective, a semiconductor optical device according to an embodiment of the present invention comprises an n-type InP substrate; a stack structure on the InP substrate including a waveguide and active layers; a first grating formed under the stack structure and on the InP substrate; and a second grating formed on the stack structure.

It is preferable that the semiconductor optical device further comprises an n-type InP clad layer formed between the first grating and the stack structure. It is preferable that the semiconductor optical device further comprises a p-type InP clad layer formed between the stack structure and the second grating.

It is preferable that the first grating is formed of InGaAsP.

It is preferable that the second grating is formed of undoped InGaAsP or p-type InGaAsP.

At least one of the first and second gratings may be formed of a sampled grating. Periods of the first and second gratings may be different.

It is preferable that the waveguide layer is formed of InGaAsP.

The active layer may be formed in a multi-quantum well structure including a well formed of an InGaAsP layer. The active layer may be formed essentially of a bulk layer of InGaAsP.

It is preferable that the stack structure includes a separation confinement hetero-structure (SCH) including a first and second optical waveguide layers formed on and under the active layer interposing the active layer therebetween. It is preferable that the first and second optical waveguide layers are formed of InGaAsP, respectively.

To accomplish the above objective of the present invention, a semiconductor optical device according to a second embodiment of the present invention comprises a resonator having three regions consisting of reflective, optical gain, and phase control regions, wherein at least one region of the reflective and optical gain regions includes: an n-type InP substrate; a stack structure on the InP substrate including a waveguide and active layers; a first grating formed under the stack structure and on the InP substrate; and a second grating formed on the stack structure.

To accomplish another objective of the present invention, a method for manufacturing a semiconductor optical device forms a first grating on an n-type InP substrate. An n-type InP clad layer is formed on the first grating. A waveguide layer is formed on the n-type InP clad layer. An active layer is formed on the waveguide layer. A p-type InP clad layer is formed on the active layer. A second grating is formed on the p-type InP clad layer.

It is preferable that the first and second gratings are formed by a conventional holography method, respectively.

In the method for manufacturing a semiconductor optical device, in order to form a first grating, a first grating layer is formed on the InP substrate. An n-type InP layer is formed on the first grating layer. A first silicon nitride layer is formed on the n-type InP layer. A first photoresist pattern is formed on the first silicon nitride layer by a laser holography method to expose a portion of the first silicon nitride layer. A first silicon nitride pattern for exposing the n-type InP layer is formed by dry etching the first silicon nitride layer while using the first photoresist pattern as an etch mask. The first grating by etching the n-type InP and first grating layers is formed while using the first silicon nitride layer pattern as an etch mask.

It is preferable that a first sampled grating is formed by removing the first grating from a portion of the InP substrate.

In the method for manufacturing a semiconductor optical device, in order to form the second grating, a second grating layer is formed on the p-type InP clad layer. A p-type InP layer is formed on the second grating layer. A second silicon nitride layer is formed on the p-type InP layer. A second photoresist pattern is formed on the second silicon nitride layer by a laser holography method to expose a portion of the silicon nitride layer. A second silicon nitride layer pattern for exposing the p-type InP layer is formed by dry etching the second silicon nitride layer while using the second photoresist pattern as an etch mask. The second grating is formed by etching the p-type InP and second grating layers while using the second silicon nitride layer pattern as an etch mask.

It is preferable that a second sampled grating is formed by removing the second grating from a portion of the InP substrate.

According to the present invention, the optical device including the gratings can be manufactured at a high yield without using expensive equipment to manufacture a self-pulsating DFB laser diode at a high yield as demand for the self-pulsating DFB laser diode increases. Moreover, the semiconductor optical device according to the present invention includes differential gratings to improve the characteristic of the optical device, and forms the gratings having different characteristics on and under the active layer by overcoming functional limit of the device having single-layer gratings so as to manufacture various types of optical devices.

BRIEF DESCRIPTION OF THE DRAWINGS

The above objective and advantages of the present invention will become more apparent by describing in detail preferred embodiments thereof with reference to the attached drawings in which.

DETAILED DESCRIPTION OF THE INVENTION

Figure 1:
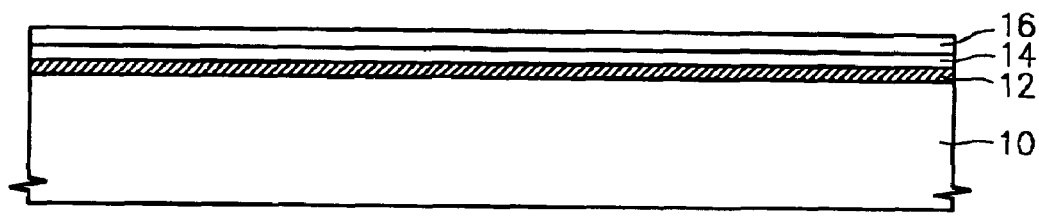
FIGS. 1 through 11 are sectional views of stages in the manufacture of a semiconductor optical device according to a first embodiment of the present invention.

The present invention now will be described more fully with reference to the accompanying drawings, in which preferred embodiments of the invention are shown. This invention may, however, be embodied in many different forms and should not be construed as being limited to the embodiments set forth herein. In the drawings, the thickness of layers and regions are exaggerated for clarity. It will also be understood that when a layer is referred to as being "on" another layer or substrate, it can be directly on the other layer or substrate, or intervening layers may also be present.

FIGS. 1 through 11 are sectional views of stages in the manufacture of a semiconductor optical device according to a first embodiment of the present invention. The present embodiment illustrates a method for manufacturing a self-pulsating distributed feedback (DFB) laser diode, which realizes a very high speed and ultrashort pulse by generating a self-pulsation.

Referring to FIG. 1, a first grating layer 12 formed of InGaAsP ($\lambda_{PL}$=1.3 $\mu$m) is grown on an n-type InP substrate 10, to a thickness of about 100 to 500 Å to form a first grating as a lower waveguide. Thereafter, an n-type InP layer 14 is grown to a thickness of about 100 Å. Next, a first silicon nitride layer (SiNx layer) 16 with a thickness of 500 Å is formed on the n-type InP layer 14 to form the first grating by a holography method.

Figure 2:
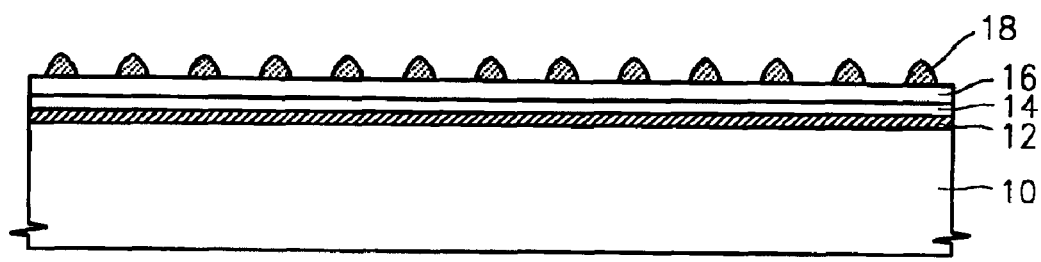

Referring to FIG. 2, a photoresist is coated on the first silicon nitride layer 16 to form a first photoresist pattern 18 of a sine wave type by the holography method so as to expose portions of the first silicon nitride layer 16. In this case, a holography system formed of argon ion lasers is used, and periods are determined by angles formed by two interfering argon ion laser beams. The DFB laser diode is closely related to the structure of an active layer. In order to adjust the pulsation wavelength of the laser diode around a wavelength of 1.55 $\mu$m at which the propagation loss of an optical fiber as a link of an optical communication system is the smallest, the period of about 240 nm is used.

Figure 3:
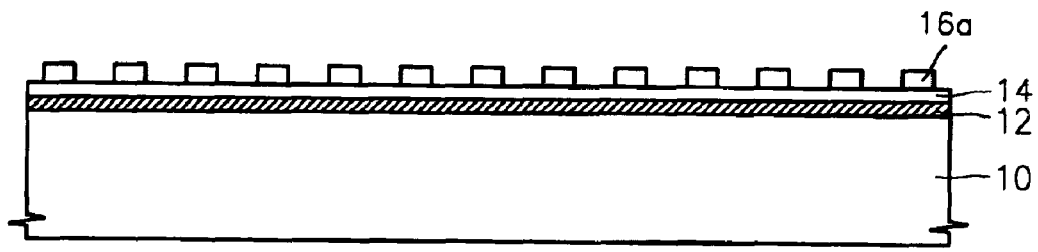

Referring to FIG. 3, the first silicon nitride layer 16 is dry etched by magnetically enhanced reactive ion etcher (MERIE) while using the first photoresist pattern 18 as an etch mask to form a first silicon nitride layer pattern 16a that exposes the n-type InP layer 14. Then, the first photoresist pattern 18 is removed.

Figure 4:
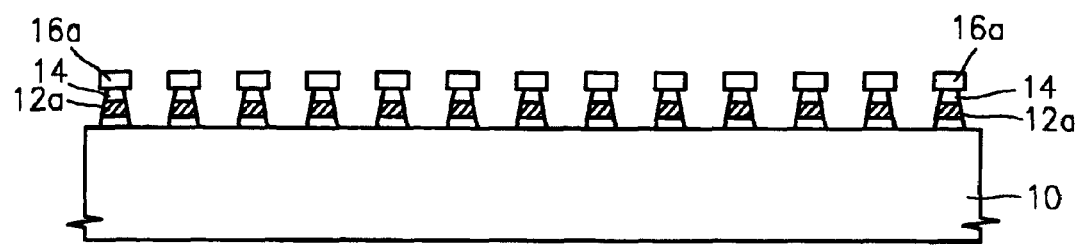

Referring to FIG. 4, a resultant structure of FIG. 3 is etched by a non-selective etchant while using the first silicon nitride layer pattern 16a as an etch mask to form a first grating 12a.

Figure 5:
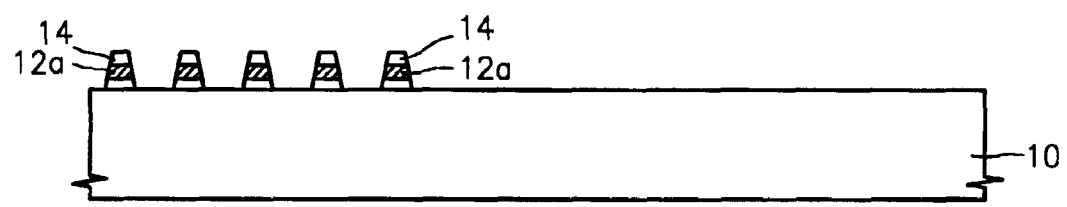

Referring to FIG. 5, in order to manufacture the self-pulsating DFB laser diode or an optical device of a special use, the first grating 12a is removed from the n-type InP substrate 10 except for a portion of the first grating 12a. For this end, a lithography process is performed after removing the first silicon nitride layer pattern 16a. Namely, the exposed n-type InP layer 14 and first grating 12a are sequentially etched and removed by a non-selective etchant while using a photoresist pattern (not shown), which covers the portion of the first grating 12a, as an etch mask. As a result, the first grating 12a of a desired shape remains on a selected region.

Figure 6:
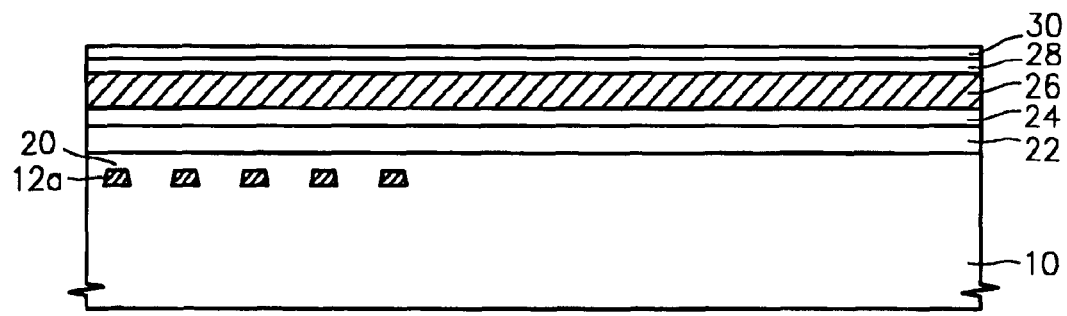

Referring to FIG. 6, an n-type InP clad layer 20 is re-grown and planarized on a resultant structure having the first grating 12a, for a thickness of about 1000 Å by a metal-organic chemical vapor deposition (MOCVD) process. Thereafter, InGaAsP ($\lambda_{PL}$=1.18 $\mu$m) is sequentially grown for a thickness of 0.1 to 0.3 $\mu$m to form a waveguide layer 22. In order to form a separate confinement hetero-structure (SCH), InGaAsP ($\lambda_{PL}$=1.3 $\mu$m) is grown on the waveguide layer 22, to a thickness of about 0.1 $\mu$m to form a first optical waveguide layer 24, and an active layer 26 is formed sequentially. The active layer 26 may be formed in a multi quantum well (MQW) structure comprising a well formed of InGaAsP ($\lambda_{PL}$=1.55 μm), or may be formed in a bulk layer structure formed essentially of InGaAsP ($\lambda_{PL}$= 1.55 μm) for polarization insensitivity. Next, in order to form the SCH, InGaAsP ($\lambda_{PL}$=1.3 μm) is grown on the active layer 26, to a thickness of 0.1 μm to form a second optical waveguide layer 28, and a p-type InP clad layer 30 is grown on the second optical waveguide layer 28, to a thickness of 0.1 μm. As a result, a structure for the active layer is completed.

Figure 7:
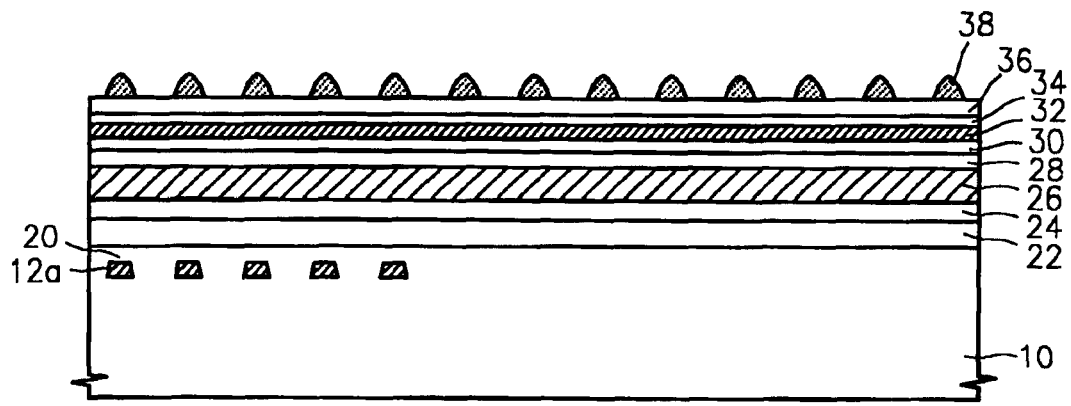

Referring to FIG. 7, in order to form the differential grating, a second grating has to be formed on the upper portion of the active layer 26. To this end, an undoped InP layer or a p-type InP layer is grown to a thickness of about 0.1 μm right after growing the active layer 26, and an undoped InGaAsP layer or a p-type InGaAsP ($\lambda_{PL}$=1.3 μm) layer is grown to a thickness of about 100 to 500 Å so as to form a second grating layer 32. Sequentially, a p-type InP layer 34 is grown on the second grating layer 32, to a thickness of about 100 Å. A second silicon nitride layer (SiNx layer) 36 having a thickness of about 500 Å is formed on the p-type InP layer 34 by the same method as described in FIGS. 1 and 2. The photoresist is coated on the second silicon nitride layer 36 to form a second photoresist pattern 38 of a sine wave type by the holography method so as to expose portions of the second silicon nitride layer 36.

Figure 8:
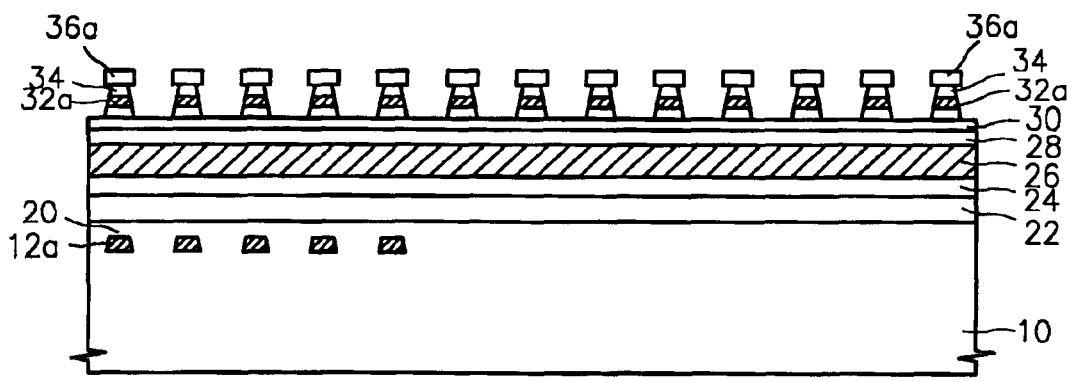

Referring to FIG. 8, the second silicon nitride layer 36 is dry etched by the MERIE while using the second photoresist pattern 38 as an etch mask to form a second silicon nitride layer pattern 36a that exposes the p-type InP layer 34. Thereafter, the second photoresist pattern 38 is removed. The resultant structure is etched by a non-selective etchant while using the second silicon nitride layer pattern 36a as an etch mask to form a second grating 32a.

Figure 9:
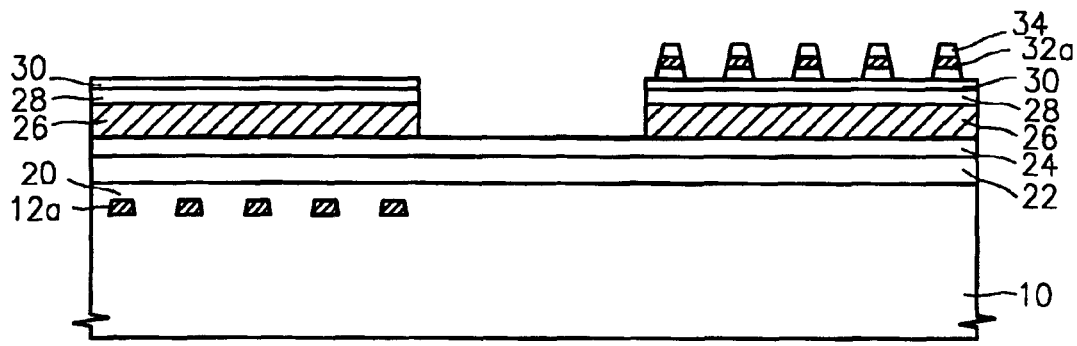

Referring to FIG. 9, a portion of the second grating 32a is removed by the lithography process as described with reference to FIG. 5 so that a selected portion of the second grating 32a remains. Accordingly, the second grating 32a having characteristics different from the first grating 12a is formed.

In the case of forming the self-pulsating DFB laser diode including a resonator, which is formed of a reflective region, an optical gain region, and a phase control region, it is preferable that the active layer 26 is removed from the phase control region to improve the characteristic of the optical device. The reason is that the phase control region is in a structure of controlling a phase by injecting currents or biasing voltage. In the case that the active layer exists on the phase control region, the refractive index is seriously changed by the injection of the currents or the biasing voltage. Accordingly, the active layer 26 is removed from the phase control region by the lithography and etch processes, after forming the second grating 32a. As a result, the first optical waveguide layer 24 is exposed through the phase control region as shown in FIG. 9.

Alternatively, the waveguide layer 22 alone may remain in the phase control region. In order to form such a structure, an InP layer (not shown) as an etch stopper is formed to a thickness of about 100 Å after forming the waveguide layer 22 and before forming the first optical waveguide layer 24. When the InP layer is used as the etch stopper in an etch process for removing the active layer 26 from the phase control region, the optical device can be conveniently manufactured.

Alternatively, an additional waveguide layer (not shown) may be formed in the phase control region from which the active layer 26 is removed, to be butt coupled with the active layer 26 so as to form a resonator while not forming the waveguide layer 22. In this case, the active layer 26 and the waveguide layer can be efficiently coupled to conveniently manufacture the optical device.

The processes after forming the second grating 32a can vary in accordance to the characteristics of the optical device to be manufactured.

Figure 10:
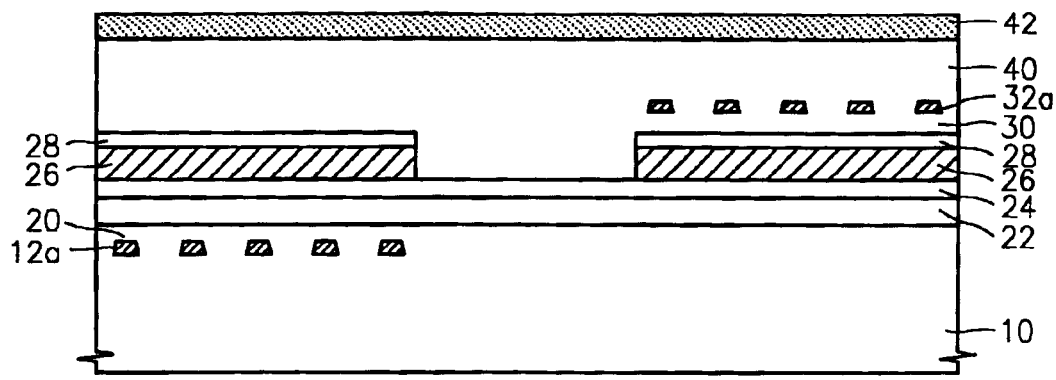

Referring to FIG. 10, after forming the second grating 32a and the active layer 26 in accordance with the characteristics of the device, the p-type InP layer as a portion of the p-type InP clad layer 30 is re-grown and planarized to a thickness of about 0.5 μm. Thereafter, a waveguide for the resonator is formed, and the p-type InP, n-type InP, and p-type InP layers as current block layers are re-grown on the regions other than the region for the resonator by the MOCVD method so as to manufacture a planar buried heterostructure (PBH) type optical device. Next, a p-type clad layer 40 and an InGaAs layer 42 having high electrical conductivity are re-grown by the MOCVD method.

Figure 11:
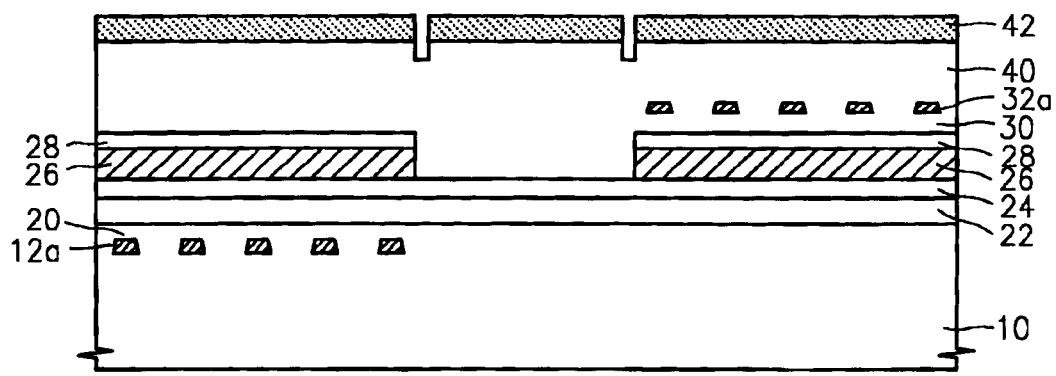

Referring to FIG. 11, a silicon nitride layer (not shown) is formed on the resultant structure having the InGaAs layer 42, and the InGaAs layer 42 in the regions without the active layer 26 is etched and removed by the lithography and etch methods. Consequently, the currents are injected only to the active layer 26 while the silicon nitride layer blocks the currents to other portions.

The preferred embodiment illustrates a method for manufacturing a self-pulsating DFB laser device; however, the present invention is not limited to the embodiment described above. For example, a method for manufacturing a semiconductor optical device according to the present invention can be applied to a method for manufacturing an optical device including a grating, such as a conventional index-coupled or complex-coupled DFB laser diode.

Figure 12:
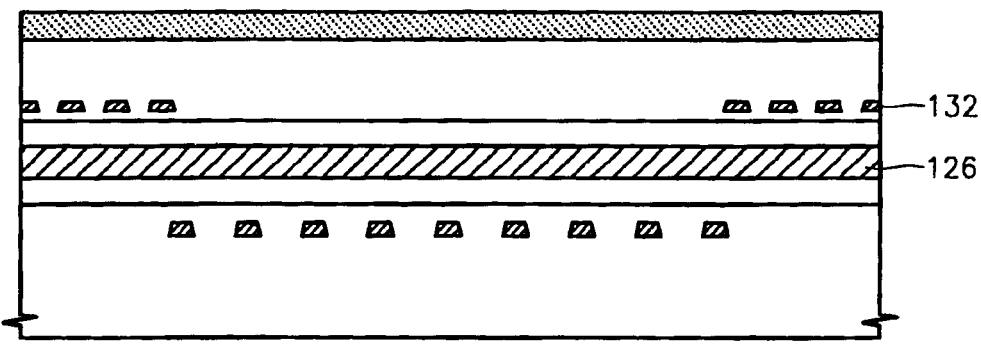
FIG. 12 is a sectional view illustrating a method for manufacturing a semiconductor optical device according to a second embodiment of the present invention.
Figure 13:
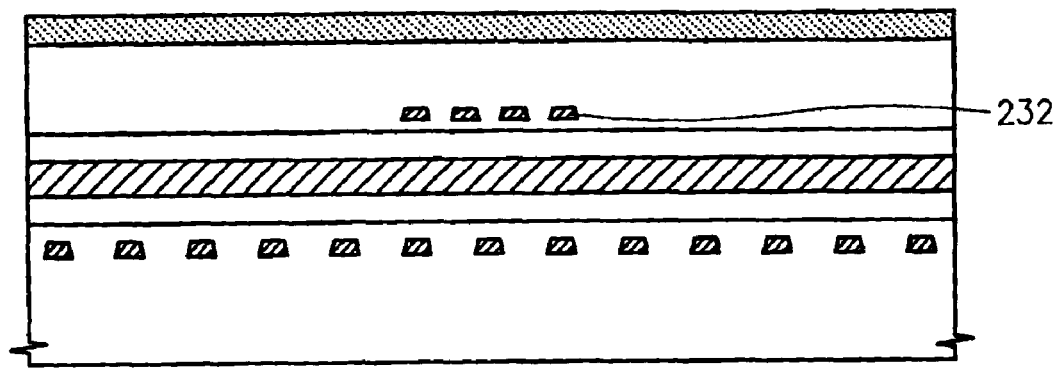
FIG. 13 is a sectional view illustrating a method for manufacturing a semiconductor optical device according to a third embodiment of the present invention.

FIGS. 12 and 13 illustrate the structures of optical devices having novel functions according to the present invention. As shown in FIG. 12, an InGaAs layer, which derivates the absorption of optical wave progressing in an optical device, is formed as a grating 132 above an active layer 126, instead of a conventional grating layer of InGaAsP ($\lambda_{PL}$=1.3 μm). Accordingly, a defect of a conventional index coupled DFB laser diode caused by the absorption of optical waves around a sectional surface, can be prevented. Referring to FIG. 13, an absorptive grating layer 232 is inserted into the middle of a resonator to prevent a spatial hole burning problem of a conventional laser diode. Moreover, sampled gratings having different periods may be formed on and under an active layer to manufacture a wavelength variable laser diode with a wide wavelength tuning range and a high side mode suppression (SMR).

As a result, when differential gratings are manufactured by a holography method like in manufacturing a semiconductor optical device according to the present invention, an optical device having novel functions can be manufactured and conventional problems in manufacturing the optical devices can be overcome.

In order to manufacture an optical device using a differential grating structure according to the present invention, a re-growing characteristic of excellent quality has to be provided, because the differential grating structure requires the re-growing process. If accidental inner loss occurs by the re-growing process, the characteristic of the optical devices is seriously affected.

Figure 14:
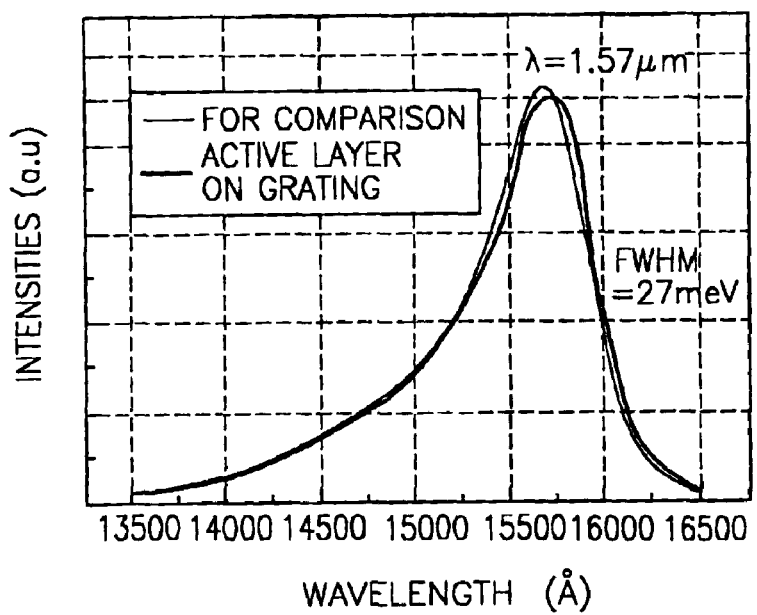
FIG. 14 is a graph illustrating the evaluation result of a photoluminescence (PL) characteristic of an active layer, which is re-grown on a grating of the semiconductor optical device according to the present invention.

FIG. 14 is a graph illustrating an evaluation result of a photoluminescence (PL) characteristic of an active layer, which is re-grown on a grating of a semiconductor optical device according to the present invention. In detail, an InGaAsP ($\lambda_{PL}$=1.3 µm) layer as a grating layer is grown on an n-type InP substrate to form a grating. Then, an active layer is grown on the grating by an MOCVD method to evaluate a PL intensity on the active layer. For comparison, an active layer is directly formed on an n-type InP substrate without a grating to evaluate a PL intensity on the active layer. According to FIG. 14, there is no significant difference between the PL intensities of the active layers formed on the grating and on the substrate without the grating. Consequently, the additional re-growing process does not affect the PL intensity. Therefore, functional optical devices can be manufactured with an excellent yield by the methods for manufacturing gratings, while using a holography method according to the present invention.

The semiconductor optical device according to the present invention has a differential grating structure in which the gratings are formed on and under an active layer. In order to form such a structure, the gratings are formed by a holography method, which improves the yield of devices. Accordingly, the optical device can be manufactured without using expensive equipment, and a self-pulsating DFB laser diode is manufactured with an excellent yield.

Moreover, since the semiconductor optical device according to the present invention includes differential gratings, when the structure of the semiconductor device is applied to a method for manufacturing a conventional optical device including gratings, the characteristic of the optical device is improved and an optical device having novel functions can be manufactured. In other words, by forming the differential gratings on and under an active layer by a holography method according to the present invention, a self-pulsating DFB laser diode, which is used for sampling a pulse laser and an optical clock, can be conveniently manufactured while manufacturing a novel semiconductor optical device.

According to a method for manufacturing a semiconductor optical device according to the prevent invention, gratings in a dual structure with different coupling coefficients are used, and the period of gratings, which controls diffraction and reflection characteristics, is independently determined by a holography method. Accordingly, functions of the device are improved from functions of a device having a single layer grating, and a multifunctional optical device can be developed. For example, a conventional DFB laser diode uses an index-coupled grating, which obtains a filtering characteristic by varying a real number portion of a refractive index. In this case, an optical output spectrum seriously varies according to the location of a grating on a section surface so that it is difficult to obtain a high single mode pulsation yield. However, according to the present invention, index-coupled and complex-coupled gratings are formed on and under an active layer to define the phase of a section surface, thereby improving a yield. Moreover, a complex-coupled grating having a predetermined length is formed in the middle of a resonator of an optical device to vary the density of photons in the resonator, thereby stabilizing the characteristic of a single mode laser diode.

It is noted that the present invention is not limited to the preferred embodiment described above, and it is apparent that variations and modifications by those skilled in the art can be effected within the spirit and scope of the present invention defined in the appended claims.

What is claimed is:

1. A semiconductor optical device comprising:
    a resonator having three regions comprising reflective, optical gain, and phase control regions,
    wherein at least one region of the reflective and optical gain regions includes:
    an n-type InP substrate;
    a stack structure on the InP substrate including a waveguide and active layers;
    a first grating formed under the stack structure and on the InP substrate; and
    a second grating formed on the stack structure.

2. The semiconductor optical device of claim 1, further comprising an n-type InP clad layer formed between the first grating and the stack structure.

3. The semiconductor optical device of claim 1, further comprising a p-type InP clad layer formed between the stack structure and the second grating.

4. The semiconductor optical device of claim 1, wherein the first grating is formed of InGaAsP.

5. The semiconductor optical device of claim 1, wherein the second grating is formed of undoped InGaAsP or p-type InGaAsP.

6. The semiconductor optical device of claim 1, wherein at least one of the first and second gratings is formed of a sampled grating.

7. The semiconductor optical device of claim 1, wherein periods of the first and second gratings are different.

8. The semiconductor optical device of claim 1, wherein the waveguide layer is formed of InGaAsP.

9. The semiconductor optical device of claim 1, wherein the active layer is formed in a multi-quantum well structure including a well formed of an InGaAsP layer.

10. The semiconductor optical device of claim 1, wherein the active layer is formed essentially of a bulk layer of InGaAsP.

11. The semiconductor optical device of claim 1, wherein the stack structure includes a separation confinement heterostructure (SCH) including a first and second optical waveguide layers formed on and under the active layer interposing the active layer therebetween.

12. The semiconductor optical device of claim 1, wherein the first and second optical waveguide layers are formed of InGaAsP, respectively.

13. A method for manufacturing a semiconductor optical device comprising the acts of:
    forming a first grating on an n-type InP substrate including three regions for forming reflective, optical gain, and phase control regions, respectively;
    forming an n-type InP clad layer on the first grating;
    forming a waveguide layer on the n-type InP clad layer;
    forming an active layer on the waveguide layer;
    forming a p-type InP clad layer on the active layer; and
    forming a second grating on the p-type InP clad layer.

14. The method of claim 13, wherein the first and second gratings are formed by a laser holography method, respectively.

15. The method of claim 13, wherein the act of forming the first grating includes the acts of:
    forming a first grating layer on the InP substrate;
    forming an n-type InP layer on the first grating layer;
    forming a first silicon nitride layer on the n-type InP layer;
    forming a first photoresist pattern on the first silicon nitride layer by a laser holography method to expose a portion of the first silicon nitride layer;

forming a first silicon nitride pattern for exposing the n-type InP layer by dry etching the first silicon nitride layer while using the first photoresist pattern as an etch mask; and forming the first grating by etching the n-type InP and first grating layers while using the first silicon nitride layer pattern as an etch mask.

16. The method of claim 15, further including the act of forming a first sampled grating by removing the first grating from a portion of the InP substrate.

17. The method of claim 13, wherein the act of forming the second grating further includes the acts of:

forming a second grating layer on the p-type InP clad layer;

forming a p-type InP layer on the second grating layer;

forming a second silicon nitride layer on the p-type InP layer;

forming a second photoresist pattern on the second silicon nitride layer by a laser holography method to expose a portion of the silicon nitride layer;

forming a second silicon nitride layer pattern for exposing the p-type InP layer by dry etching the second silicon nitride layer while using the second photoresist pattern as an etch mask; and forming the second grating by etching the p-type InP and second grating layers while using the second silicon nitride layer pattern as an etch mask.

18. The method of claim 17, further including the act of forming a second sampled grating by removing the second grating from a portion of the InP substrate.

19. The method of claim 13, further comprising the act of removing the active layer from a region for forming the phase control region.

* * * * *